US010241178B2

(12) United States Patent
Brady-Kalnay et al.

(10) Patent No.: US 10,241,178 B2
(45) Date of Patent: Mar. 26, 2019

(54) SYSTEM AND METHOD FOR MAGNETIC RESONANCE FINGERPRINTING AT HIGH FIELD STRENGTHS

(71) Applicant: Case Western Reserve University, Cleveland, OH (US)

(72) Inventors: Susann Brady-Kalnay, Cleveland, OH (US); Vikas Gulani, Cleveland Heights, OH (US); Mark Griswold, Shaker Heights, OH (US); Chris Flask, Avon Lake, OH (US); Lan Lu, Cleveland, OH (US); Ying Gao, Cleveland, OH (US); Yun Jiang, Cleveland, OH (US); Dan Ma, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 296 days.

(21) Appl. No.: 15/169,166

(22) Filed: May 31, 2016

(65) Prior Publication Data

US 2016/0349339 A1 Dec. 1, 2016

Related U.S. Application Data

(60) Provisional application No. 62/167,969, filed on May 29, 2015.

(51) Int. Cl.
*G01V 3/00* (2006.01)
*G01R 33/561* (2006.01)
*G01R 33/50* (2006.01)
*G01R 33/565* (2006.01)

(52) U.S. Cl.
CPC ........ *G01R 33/5614* (2013.01); *G01R 33/50* (2013.01); *G01R 33/56509* (2013.01); *G01R 33/56563* (2013.01)

(58) Field of Classification Search
USPC .......................................... 324/309
See application file for complete search history.

(56) References Cited

U.S. PATENT DOCUMENTS

| | | | |
|---|---|---|---|
| 8,723,518 B2 | 5/2014 | Seiberlich | |
| 2016/0349339 A1* | 12/2016 | Brady-Kalnay | ....... G01R 33/50 |
| 2017/0315193 A1* | 11/2017 | Amthor | .................. A61B 5/055 |
| 2017/0319097 A1* | 11/2017 | Amthor | .................. A61B 5/055 |
| 2018/0106876 A1* | 4/2018 | Nielsen | .............. G01R 33/4828 |
| 2018/0204045 A1* | 7/2018 | Feiweier | ................ A61B 5/055 |

* cited by examiner

*Primary Examiner* — Rodney E Fuller
(74) *Attorney, Agent, or Firm* — Quarles & Brady LLP

(57) ABSTRACT

A system and method is provided for operating a high-field magnetic resonance (MR) system includes performing a series of data acquisition modules without respiratory gating. Each data acquisition module is formed of a steady-state free precession pulse sequence. Performing the series of data acquisition modules includes varying at least one of an amplitude of an excitation pulse or a repetition time of the steady-state free precession pulse sequence between adjacent data acquisition modules in the series of data acquisition modules to acquire a series of MR data with random or pseudo-random imaging acquisition parameters. The series of MR data is compared to a dictionary of signal evolution profiles to determine a match between the series of MR data with at least one signal evolution profile in the dictionary indicating at least one quantitative parameter in the subject.

20 Claims, 5 Drawing Sheets

SYSTEM AND METHOD FOR MAGNETIC RESONANCE FINGERPRINTING AT HIGH FIELD STRENGTHS

CROSS-REFERENCE TO RELATED APPLICATIONS

This application is based on, claims the benefit of, and incorporates herein by reference in its entirety U.S. Provisional Patent Application 62/167,969, filed May 29, 2015.

STATEMENT REGARDING FEDERALLY SPONSORED RESEARCH

This invention was made with government support under CA179956, DK085099, and DK100014 awarded by the National Institutes of Health. The government has certain rights in the invention.

BACKGROUND

The present disclosure relates generally to systems and methods for performing magnetic resonance (MR) studies. More particularly, the disclosure relates to systems and methods for performing magnetic resonance fingerprinting (MRF) at high field strengths, such as 4.7 Tesla (T) and above.

MR studies use the nuclear magnetic resonance (NMR) phenomenon to produce images. When a substance such as human tissue is subjected to a uniform magnetic field, such as the so-called main magnetic field, $B_0$, of an MRI system, the individual magnetic moments of the nuclei in the tissue attempt to align with this $B_0$ field, but precess about it in random order at their characteristic Larmor frequency, $\omega$. If the substance, or tissue, is subjected to a so-called excitation electromagnetic field, $B_1$, that is in the plane transverse to the $B_0$ field and that has a frequency near the Larmor frequency, the net aligned magnetic moment, referred to as longitudinal magnetization, may be rotated, or "tipped," into the transverse plane to produce a net transverse magnetic moment, referred to as transverse magnetization. A signal is emitted by the excited nuclei or "spins" after the excitation field, $B_1$, is terminated, and this signal may be received and processed to form an image.

Though the most-common clinical MR systems utilize a static magnetic field strength of 1.5 Tesla (T) or 3.0 Tesla (T), high field, preclinical ($\geq 4.7$ T) MRI scanners are also available. In contrast to clinical MRI scanning, high-field preclinical MRI studies are often quantitative by nature and may require assessment of multiple imaging parameters during a single scanning session. These quantitative preclinical MRI studies provide the opportunity to assess pathophysiologic changes associated with disease progression and therapeutic efficacy. In addition, rigorous validation of these MRI assessments has the potential to inform future clinical imaging studies. Therefore, a significant effort is ongoing to develop robust and effective acquisition and reconstruction techniques that can be used routinely in clinical practice preclinical MRI acquisition and reconstruction techniques.

Conventional MRI quantification methods are typically based on linear or nonlinear curve fitting to various MRI models. The implementation of these established model-based methods, such as $T_1$ and $T_2$ relaxation time estimation, are straightforward. However, these conventional quantification methods are susceptible to multiple sources of errors including cardiac and respiratory motion artifacts, as well as, inhomogeneity in the main magnetic field ($B_0$). Importantly, the potential for these errors are significantly increased on high field preclinical MRI scanners, where $B_0$ inhomogeneities are increased, and other confounding factors can also be present. In addition, temporal errors can be observed in high-field studies that require multiple imaging parameter estimates (ex. diffusion and perfusion) and extended or sequential scans. Therefore, new MRI acquisition and reconstruction methods for preclinical imaging applications are needed that are not as susceptible to these error sources and can readily obtain estimates of multiple imaging parameters simultaneously.

SUMMARY

The present disclosure overcomes the aforementioned drawbacks by providing a system and method for performing quantitative assessments using MR systems at high static magnetic field strengths. A magnetic resonance fingerprinting (MRF) process is performed using a steady-state free precession (SSFP) pulse sequence that is repeated in a series of acquisition modules using temporally-varying imaging parameters during free breathing to acquire the MRF data. The quantitative MRF maps are then obtained using an MRF matching process.

In accordance with one aspect of the disclosure, a method is provided for operating a high-field magnetic resonance (MR) system to acquire quantitative data from a subject arranged with in the MR system. The method includes controlling the high-field MR system to perform a preparation module configured to perform one of an inversion pulse or a magnetization preparation. The method also includes controlling the high-field MR system to perform a series of data acquisition modules without respiratory gating. Each data acquisition module is formed of a steady-state free precession pulse sequence. Performing the series of data acquisition modules includes varying at least one of an amplitude of an excitation pulse or a repetition time of the steady-state free precession pulse sequence between adjacent data acquisition modules in the series of data acquisition modules to acquire a series of MR data with random or pseudo-random imaging acquisition parameters. The method also includes comparing the series of MR data to a dictionary of signal evolution profiles to determine a match between the series of MR data with at least one signal evolution profile in the dictionary and generating a report indicating at least one quantitative parameter in the subject based on the MR data and the match to the at least one signal evolution profile in the dictionary.

In accordance with another aspect of the disclosure, a magnetic resonance (MR) system is disclosed that includes a magnet system configured to generate a static magnetic field of at least 4.7 Tesla about at least a portion of a subject arranged in the MR system. The MR system also includes a gradient system configured to establish at least one magnetic gradient field with respect to the static magnetic field and a radio frequency (RF) system configured to deliver excitation pulses to the subject and acquire imaging data from the subject. The MR system further includes a computer system programmed to control the gradient system and RF system to perform a preparation module including one of an inversion pulse or a magnetization preparation. The computer system is also programmed to control the gradient system and RF system to perform a series of data acquisition modules, wherein each data acquisition module is formed of a steady-state free precession pulse sequence. Performing the series of data acquisition modules also includes varying at least one of an amplitude of an excitation pulse or a repetition time of the steady-state free precession pulse sequence between adjacent data acquisition modules in the series of data acquisition modules to acquire a series of MR data including respiratory spikes. The computer system is further programmed to compare the series of MR data to a dictionary of signal evolution profiles to determine a match between the series of MR data with at least one signal evolution profile in the dictionary and, based on the match, determine at least one quantitative parameter of the subject.

In accordance with another aspect of the disclosure, a method is disclosed for operating a high-field magnetic resonance (MR) system to perform a magnetic resonance fingerprinting process. The method includes controlling a high-field MR system with a static magnetic field of at least 4.7 Tesla to perform a preparation module configured to perform one of an inversion pulse or a magnetization preparation. The method also includes controlling the high-field MR system to, following the preparation module, perform a series of data acquisition modules without respiratory gating. Each data acquisition module is formed of a steady-state free precession pulse sequence and wherein performing the series of data acquisition modules includes imaging parameters to acquire a series of MR data. The method also includes performing a magnetic resonance fingerprinting reconstruction process by comparing the series of MR data to a dictionary to generate a report indicating at least one quantitative parameter in the subject.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
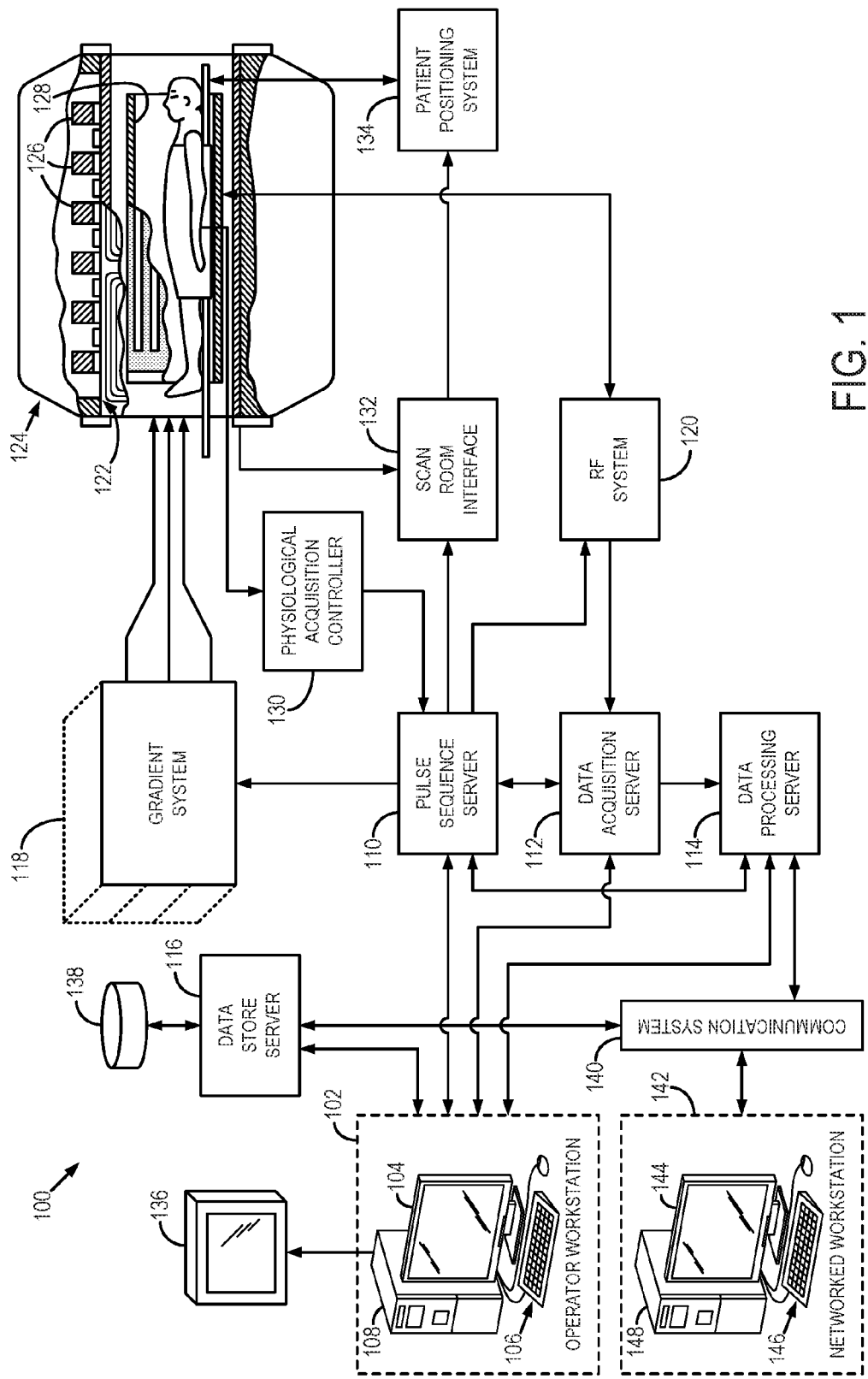
FIG. 1 is a block diagram of an example of a magnetic resonance imaging (MRI) system configured to employ the present disclosure.

Over the last few years, a new category of quantification in MRI has emerged that uses dictionary-based methods to "match" acquired data rather than conventional parameter estimation techniques using error-minimization methods. Some of these methods, which leverage compressed sensing for parameter mapping, have been developed for both clinical and preclinical applications and have been shown to limit quantification errors and/or reduce the overall time to acquire quantitative data sets. More recently, a magnetic resonance fingerprinting (MRF) has been introduced. MRF uses a distinct acquisition and quantification strategy that combines a priori acquisition parameter variation with a dictionary-based matching algorithm to obtain quantitative assessments of multiple imaging parameters simultaneously. Further description of the fundamentals of MRF is described in co-pending application Ser. No. 13/051,044, which is incorporated herein by reference in its entirety.

The MRF technique was initially developed for low-field (1.5 T-3 T), clinical MRI scanners and was used to simultaneously generate $T_1$, $T_2$, and $M_0$ maps in healthy human brains. The present disclosure recognizes that the MRF technique can be leveraged to inherently resist errors due to motion artifacts as motion or noise is not included/encoded into the theoretical signal evolution profiles that make up the MRF dictionary. Therefore, MRF provides a basis to generate multi-parametric assessments for high-field imaging applications with limited impact of motion artifacts.

As will be described, the present disclosure provides an effective MRF acquisition and analysis algorithm for high-field, MRI scanners, such as are generally found in only preclinical situations. A priori variation, such as generally random or pseudo-random, in flip angles (FA) and repetition time (TR) variations can be combined with any dynamic MR acquisition (e.g., steady-state free precession, gradient-recalled echo, True Fast Imaging with Steady-State Free Precession (True FISP), spoiled gradient echo) to simultaneously generate quantitative maps of $T_1$ and $T_2$ relaxation times or other MR parameters (e.g., perfusion, diffusivity, etc.) from a single scan. Random and pseudo-random imaging parameters can be selected or determined in any of a variety of manners.

Notably, FISP is but one example of a pulse sequence, as will be described. Other multi-echo, gradient echo sequences include, as non-limiting examples, GRASS, CE-FAST, SPGR (FLASH), and GRASE. Evaluation of these MRF estimates of $T_1$, $T_2$, and $M_0$, in phantoms in comparison with conventional MRI techniques with much longer acquisition times showed favorable results. In vivo MRF data from healthy brain and kidneys verify the robustness of the MRF technique to respiratory motion artifacts. In vivo MRF data from a glioma model demonstrates the sensitivity of the MRF technique to known pathology as shown by histology. The impact of RF excitation pulse profile as well as the number of acquired MRF images on the $T_1$ and $T_2$ estimates have also been demonstrated. It must also be noted that the MRF methodology can be combined with a flexible preparation module or modules to obtain estimates of virtually any MRI parameter (e.g., perfusion, chemical exchange saturation transfer, pH, amide proton transfer, etc.).

Referring to FIG. 1, an example of an MRI system 100 is illustrated. The MRI system 100 includes a workstation 102 having a display 104 and a keyboard 106. The workstation 102 includes a processor 108 that is commercially available to run a commercially-available operating system. The workstation 102 provides the operator interface that enables scan prescriptions to be entered into the MRI system 100. The workstation 102 is coupled to four servers: a pulse sequence server 110; a data acquisition server 112; a data processing server 114; and a data store server 116. The workstation 102 and each server 110, 112, 114, and 116 are connected to communicate with each other.

The pulse sequence server 110 functions in response to instructions downloaded from the workstation 102 to operate a gradient system 118 and a radiofrequency (RF) system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128 and/or local coil.

RF excitation waveforms are applied to the RF coil 128, or a separate local coil, such as a head coil, by the RF system 120 to perform the prescribed magnetic resonance pulse sequence. Responsive MR signals detected by the RF coil 128, or a separate local coil, are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays.

The RF system 120 also includes one or more RF receiver channels. Each RF receiver channel includes an RF preamplifier that amplifies the MR signal received by the coil 128 to which it is connected, and a detector that detects and digitizes the quadrature components of the received MR signal. The magnitude of the received MR signal may thus be determined at any sampled point by the square root of the sum of the squares of the I and Q components:

$$M=\sqrt{I^2+Q^2} \qquad (1),$$

and the phase of the received MR signal may also be determined:

$$\varphi = \tan^{-1}\left(\frac{Q}{I}\right). \qquad (2)$$

The pulse sequence server 110 also optionally receives patient data from a physiological acquisition controller 130. The controller 130 receives signals from a number of different sensors connected to the subject to be scanned, such as electrocardiograph (ECG) signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. A patient positioning system 132 may be included.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown), from which they may be output to operator display 104 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network or communication system 140 to other facilities that may include other networked workstations 142.

The communication system 140 and networked workstation 142 may represent any of the variety of local and remote computer systems that may be included within a given imaging facility including the system 100 or other, remote location that can communicate with the system 100. In this regard, the networked workstation 142 may be functionally and capably similar or equivalent to the operator workstation 102, despite being located remotely and communicating over the communication system 140. As such, the networked workstation 142 may have a display 144 and a keyboard 146. The networked workstation 142 includes a processor 148 that is commercially available to run a commercially-available operating system. The networked workstation 142 may be able to provide the operator interface that enables scan prescriptions to be entered into the MRI system 100.

Figure 2A:
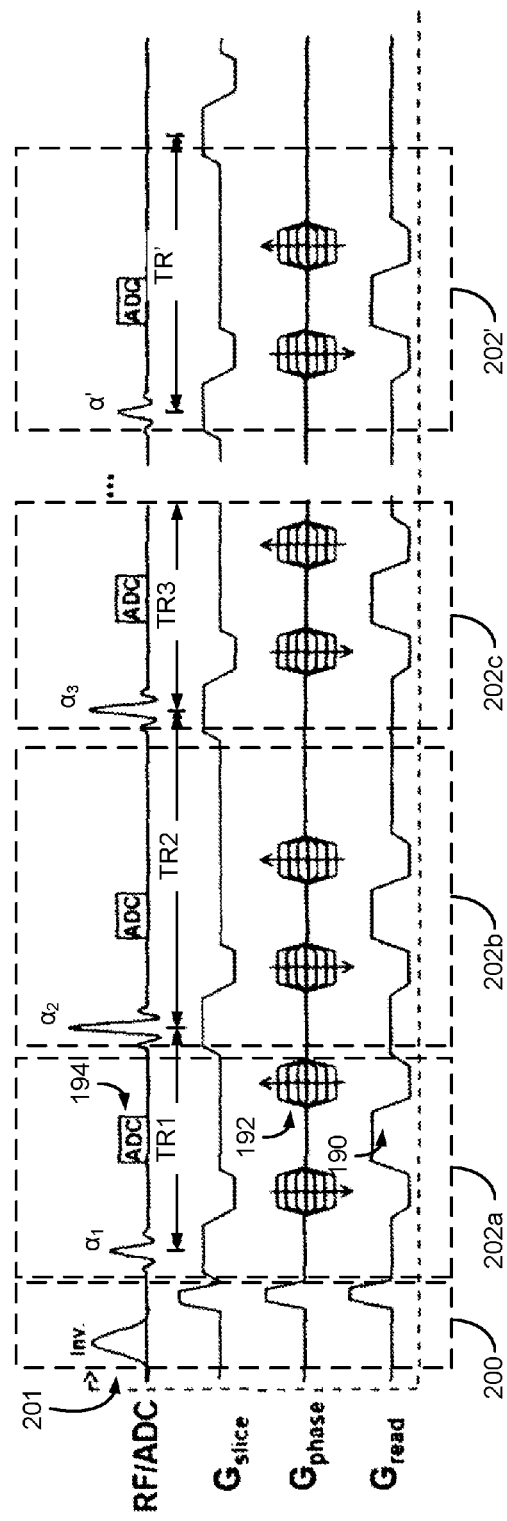
FIG. 2A is a graphic representation of an example dynamic MR pulse sequence for directing the MRI system of FIG. 1 to acquire image data in accordance with the present disclosure.

Referring to FIG. 2A, a variation on the MRF acquisition is illustrated that provides a priori variation in both FA and TR to generate $T_1$ and $T_2$ specific MRF signal evolution profiles. The FISP-MRF acquisition shown herein is only one example of a dynamic MRF acquisition and is distinguished from basic gradient echo sequences, by the inclusion of spoiler gradients 190 and rewinder gradients 192, for example, following signal readout 194. The FISP-MRF acquisition may be desirable instead of True FISP or echo planar imaging (EPI) pulse sequence to limit "banding" artifacts, which are especially problematic on high field MRI scanners due to increased inhomogeneity in the magnetic field. The FISP-MRF acquisition also provides increased $T_2$ sensitivity in comparison with other incoherent steady-state MRI techniques (ex. Fast Low Angle Shot, FLASH). However, FIG. 2A is not a traditional FISP pulse sequence. Rather, the pulse sequence of the present disclosure provides, as will be described, provides for dynamic flip angle and TR variation profiles that are designed to increase the sensitivity of the signal evolution profiles to the MR-specific parameters (i.e., $T_1$ and $T_2$).

In particular, the MRF acquisition is initiated with one or more preparation modules 200. As illustrated, the preparation module(s) 200 may include an inversion pulse 201 to enhance the overall $T_1$ sensitivity. However, in other configurations, the preparation module 200 may include a magnetization preparation scheme to sensitize the MRF acquisition to another desired parameter(s) of interest.

Figure 2C:
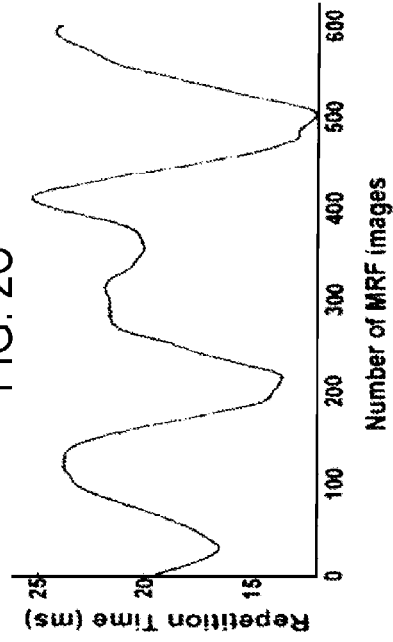
FIG. 2C is a graph showing an example of one strategy for varying repetition times in accordance with the present disclosure.
Figure 2B:
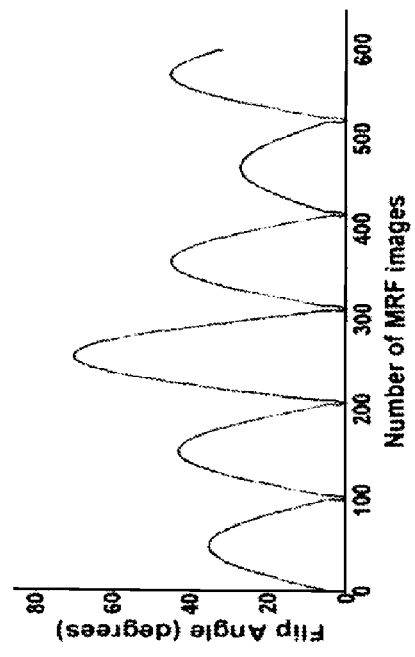
FIG. 2B is a graph showing an example of one strategy for varying flip angle (FA) degrees in accordance with the present disclosure.

The preparation module(s) 200 is/are followed by multiple (as a non-limiting example, 600) successive FISP acquisition modules 202a-202'. As illustrated, the excitation FA (in degrees) 204 of each FISP acquisition module 202a-202' varies, as does the TR (in ms) 206. Non-limiting examples of FA and TR variation profiles are shown in FIGS. 2B and 2C, respectively. In the illustrated, non-limiting example, the echo time was held constant (TE=3.2 ms). FIG. 2B shows that a repeating sinusoidal FA pattern may be used that ranges from 0 to 70 degrees. Additional FA lobes were used compared to original clinical MRF techniques to provide additional image contrast. As shown in FIG. 2C, the non-limiting example TR pattern selected was a Perlin noise pattern, similar to the original clinical MRF description. However, a higher range of TR values was in the illustrated non-limiting example (i.e., 12.0 ms to 25.3 ms) to obtain a reasonable signal-to-noise ratio (SNR) for the MRF images (e.g., 600 images).

Figure 3:
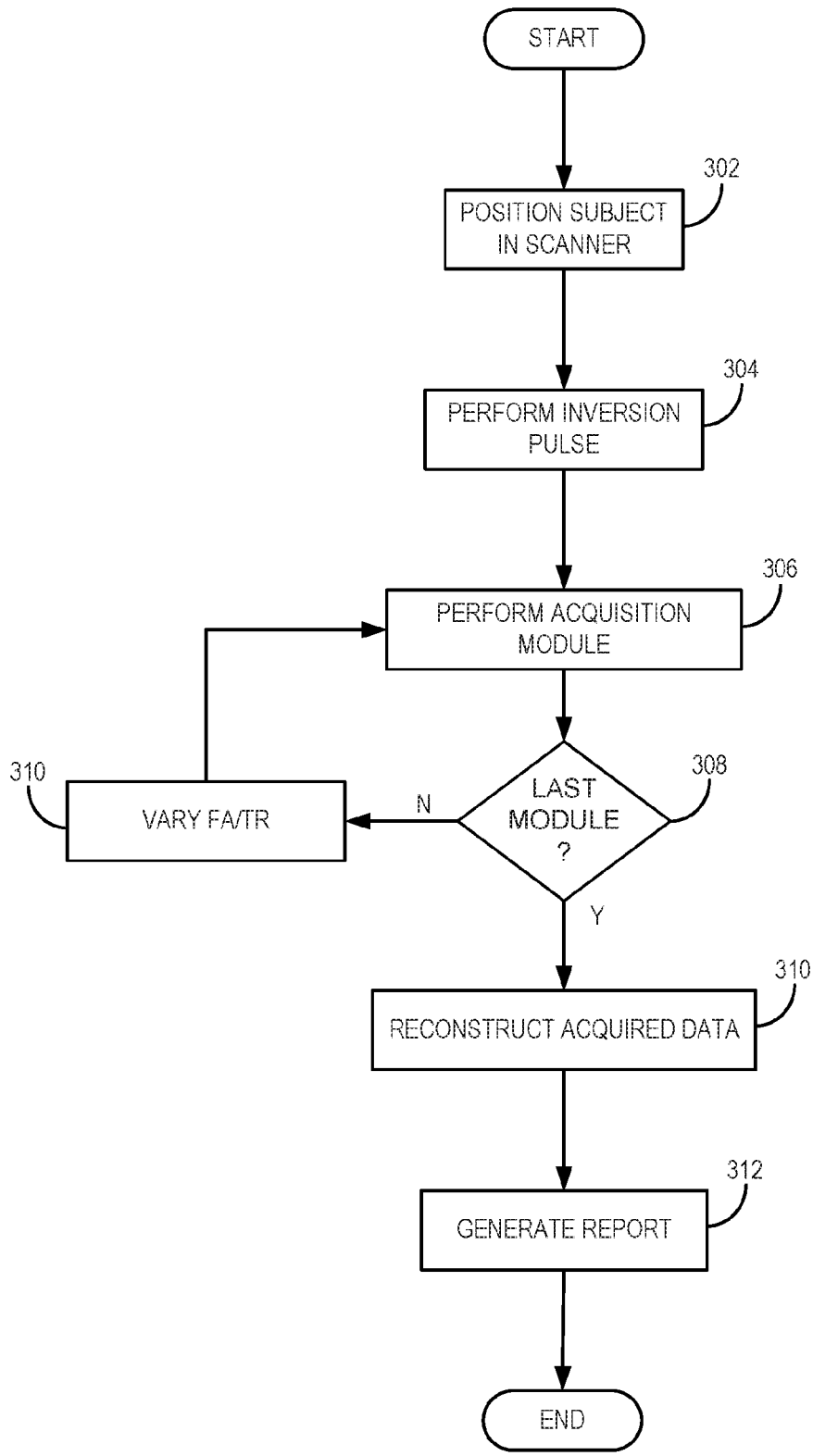
FIG. 3 is an example flow chart setting forth some non-limiting examples of steps of a method in accordance with the present disclosure.

Referring to FIG. 3, a process 300 for acquiring MRF data at high field strength (e.g., above 4.7 T) begins at process block 302 by positioning a subject within a bore of a magnetic resonance system. The system may be that of a clinically adapted scanner that is capable of operating above 4.7 T, including 7 T and above, or may be a preclinical scanner or animal scanner, such as a Bruker Biospec 7 T MRI scanner (Billerica, Mass.) equipped with a 400 mT/m magnetic field gradient insert.

To prepare for data acquisition, as described above, an inversion pulse module is performed at process block 304. Then, at process block 306 an acquisition module is performed. As described above, a series of acquisition modules are performed. Thus, at process block 308, a check is made to determine if the preceding module was the last desired module. If not, the FA and/or TR is varied at process block 310 and the next acquisition module is performed with the varied FA and/or TR. In particular, to acquire the MRF signal evolutions, the MRF acquisition of FIG. 2A was designed to acquire the same line of k-space for each of the sequential images during each MRF-scan repetition period (e.g., 11.6 seconds). The FISP-MRF kernel shown herein was designed with a filtered 7-lobe sinc radiofrequency (RF) excitation pulse ($\tau_{RF}$=2 ms, bandwidth=7000 Hz) to ensure a uniform excitation slice profile with limited excitation sidebands. Although not required, a 5-second delay was inserted after each MRF scan repetition (MRF-FISP TRs) to allow the magnetization to return to equilibrium prior to the next MRF scan repetition and to limit the duty cycle on the magnetic field gradients. This process was repeated for each line of k-space to generate, in this non-limiting example, 600 total temporal MRF images.

Once all the desired acquisition modules are completed, the acquired data can be reconstructed. The MRF reconstruction process utilizes a large dictionary of signal evolution profiles that are subsequently "matched" to the acquired MRF signal evolution profile for each imaging voxel using vector-based inner product comparisons. The MRF dictionary can be created, as described previously, using Bloch equation simulations of the MRF acquisition. However, an MRF dictionary for high field preclinical MRI scanners can be designed to reflect increased $T_1$ and decreased $T_2$ values observed on high field MRI scanners.

The MRF dictionary can include tens of thousands of profiles generated from many $T_1$ values (100 to 2000 ms, increment=10 ms; 2000 to 6000 ms, increment=500 ms) and $T_2$ values (10 to 150 ms, increment=2 ms; 150 to 300 ms, increment=5 ms) or any other MR parameter (e.g., perfusion, diffusion, chemical exchange saturation transfer). Note that the $T_1$ and $T_2$ increments in the MRF dictionary (2-10 ms for low $T_1/T_2$ values) are small relative to the expected variation observed for in vivo $T_1/T_2$ estimates. With reconstruction complete, a report can be generated at process block 312. The report can include visual reports (e.g., images or maps), text or metric based reports, audio reports, and the like.

Experiments

For example, to perform an in vitro MRF assessments of $T_1$ and $T_2$ relaxation times and proton density ($M_0$), four imaging phantoms with distinctly different $T_1$ and $T_2$ relaxation times were prepared by adding different concentrations of $MnCl_2$ (30, 100, 200, 300 μM, respectively) to distilled water. The solutions were added to 200 μL centrifuge tubes for imaging. Axial MRF images (600 total MRF images) were obtained for these phantoms. Additional MRF acquisition parameters for the phantom experiments were: FOV=3 cm×3 cm, matrix=128×128, slice thickness=1.5 mm, total acquisition time=35 min 24 s. Although larger than typical, a slice thickness of 1.5 mm was used for this initial preclinical MRF development to limit the effects of noise. Conventional inversion-recovery spin echo (IR-SE) (inversion delay times=[50, 200, 350, 500, 650, 800, 1000, 1500, 2000, 2500, 3000, 4000, 5000, 8000, 10,000] ms, TR/TE=10,000 ms/8.1 ms, one average, total acquisition time=6.7 h) and spin echo (SE) (echo times=[10, 25, 40, 60, 90, 120, 150, 300, 400, 500, 800] ms, TR=10,000 ms, one average, total acquisition time=3.9 h) methods were also implemented to generate conventional estimates of the phantom $T_1$, $T_2$, and $M_0$ values, respectively for comparison with the MRF findings. All other imaging parameters including field of view and resolution were identical for the MRF, IR-SE ($T_1$), and SE ($T_2$, $M_0$) acquisitions. Quantitative $T_1$ and $T_2$ relaxation times and proton density ($M_0$) maps were obtained from the MRF data. $T_1$ and $T_2$ relaxation time and $M_0$ maps were calculated for the conventional IR-SE and SE acquisitions using established methods.

The MRF and conventional acquisitions were repeated five times on different days to assess the reproducibility of the MRF estimates. Mean $T_1$, $T_2$, and $M_0$ values for all methods were obtained for each phantom using a region of interest (ROI) analysis. In addition, voxel-wise error maps and standard deviations for $T_1$, $T_2$, and $M_0$ were calculated to assess voxel-wise variation. Two-tailed Student's t-tests were used to compare the mean and voxel-wise variation in the MRF $T_1$, $T_2$, and $M_0$ values with the IR-SE and SE data, respectively.

Initial in vivo and ex vivo kidney MRF assessments were performed in a healthy mouse. In vivo and ex vivo MRF images were acquired for the kidneys of a 12-month old healthy mouse (C57/BL6, Jackson Labs) to assess the impact of respiratory motion. The mouse was initially anesthetized in 1-2% isoflurane with supplemental oxygen and positioned in a mouse volume coil for imaging (inner diameter=35 mm). The body temperature and breathing rate of the animal were maintained at 35±1° C. and 40-60 breaths/min with adjustable warm air and isoflurane levels, respectively. Single-slice, axial kidney MRF images were obtained for the mouse (FOV=3 cm×3 cm, matrix=128×128, slice thickness=1.5 mm). Notably, no respiratory triggering was applied for these MRF acquisitions to demonstrate the robustness of the MRF technique to respiratory motion artifacts. Immediately following the in vivo MRF scans, the isoflurane concentration was increased to 5% for 30 minutes to euthanize the mouse within the MRI scanner with no repositioning. The MRF acquisition was then repeated on the same axial kidney imaging slice to generate an ex vivo MRF dataset with no respiratory motion artifacts. All MRF acquisition and reconstruction parameters for the in vivo and ex vivo kidney experiments were the same.

Further still, initial MRF assessments in a mouse brain tumor model were also performed. In vivo and ex vivo MRF assessments were also performed on mouse brains orthotopically implanted with a human glioma cell line expressing green fluorescent protein (GFP) to demonstrate the sensitivity of the MRF technique to known pathology and to examine the effects of RF excitation slice profile on the MRF estimates of $T_1$, $T_2$, and $M_0$. To prepare the mouse glioma model, Gli36Δ5 cells were infected with GFP encoding lentivirus, harvested for intracranial implantation by trypsinization, and concentrated to $1 \times 10^5$ cells/μL in PBS. A six-week old female athymic nude mouse was anesthetized by intraperitoneal administration of 50 mg/kg ketamine/xylazine and fitted into a stereotaxic rodent frame (David Kopf Instruments, Tujunga, Calif.). Tumor cells were implanted at AP=+0.5 and ML=−2.0 from the bregma in the right striatum at a depth of 3 mm below the dura using a 10-μL syringe (26-gauge needle; Hamilton Co, Reno, Nev.). A total of 200,000 glioma cells were implanted.

In vivo MRF scans were obtained 8 days following inoculation with the tumor cells. As for the kidney MRF studies, the animal was anesthetized with 1-2% isoflurane and positioned within a 35-mm inner diameter volume coil within the 7 T Bruker Biospec MRI scanner. Conventional $T_2$-weighted images of the glioma model were obtained from a Rapid Acquisition with Relaxation Enhancement (RARE) acquisition (TR/TE=3000 ms/40.0 ms, FOV=3×3 cm, matrix=256×256, slice thickness=1.5 mm, three averages, total acquisition time=8 min) to identify the tumor region. The MRF parameters for the in vivo brain tumor assessments were (FOV=3 cm×3 cm, matrix=128×128, slice thickness=1.5 mm, excitation sinc7 pulse, total acquisition time=35 min 24 s). The in vivo brain MRF data were used to generate $T_1$, $T_2$, and $M_0$ maps reconstructed from the full MRF dataset (600 images) as well as subsets of 100, 300, and 500, images respectively to determine the number of MRF images needed for effective quantification. Mean brain $T_1$, $T_2$, and $M_0$ values were obtained from an ROI analysis of each set of MRF reconstructions for comparison.

Ex vivo MRF scans of a separate excised mouse brain tumor model were acquired to obtain an initial investigation into the impact of excitation slice profile on MRF estimates. The mouse glioma model was prepared as described above. After 10 days of tumor growth, the animal was sacrificed, and the brain was excised for fluorescence imaging using a Maestro FLEX fluorescence scanner (CRi, Hopkinton, Mass.) to verify tumor viability. Fluorescence images of the GFP-expressing Gli36Δ5 tumor cells were acquired using standard GFP filters (excitation=445-490 nm, emission=515 nm long-pass filter, acquisition settings=500-720 in 10-nm steps). Brightfield images were also acquired to provide an anatomic roadmap. Fluorescence and brightfield exposure durations were 10 milliseconds and 300 milliseconds, respectively. Fluorescence images were background subtracted and unmixed, using the Maestro software to spectrally separate brain auto-fluorescence from GFP-expressing tumor cells. The brain was then placed in neutral buffered 10% formalin (Sigma-Aldrich, Milwaukee, Wis., USA) within a 15 mL centrifuge tube for ex vivo MRF imaging.

The MRF acquisition (FOV=3 cm×3 cm, matrix=128×128, slice thickness=1.5 mm, total acquisition time=35 min 24 s) was repeated using either a filtered 7-lobe sinc radiofrequency (RF) excitation pulse ($\tau_{RF}$=2 ms) or a hermite RF excitation pulse ($\tau_{RF}$=2 ms). The slice profiles for each RF excitation pulse were measured using a conventional Fast Low Angle SHot (FLASH) acquisition (FOV=1.52 cm×1.52 cm, matrix=256×256, TR/TE=100.0 ms/10.0 ms, FA=10 degrees) by applying the readout gradient along the axial slice-select direction. Although the sinc7 pulse would be expected to provide a more uniform excitation with reduced sidebands, these two pulses were selected as they are commonly used for many preclinical MRI acquisitions. Following the ex vivo MRF acquisition, the mouse brain was sectioned at 8 μm per section and stained with hematoxylin and eosin (H&E) stains to further validate the existence of the brain tumor by histology.

Results

Example in vitro phantom images of $MnCl_2$-doped phantoms at multiple MRF timepoints (image numbers 40, 80, and 150 out of 600 total) and single-voxel signal evolution profiles the varying contrast in the phantom images at three selected time points (40, 80, 150). Resultant MRF-based $T_1$, $T_2$, and $M_0$ maps for the four $MnCl_2$-doped water phantoms are were compared to corresponding $T_1$, $T_2$, $M_0$ maps acquired using conventional inversion recovery spin echo (IR-SE) and spin echo (SE) pulse sequence.

Figures 4A, 4B:
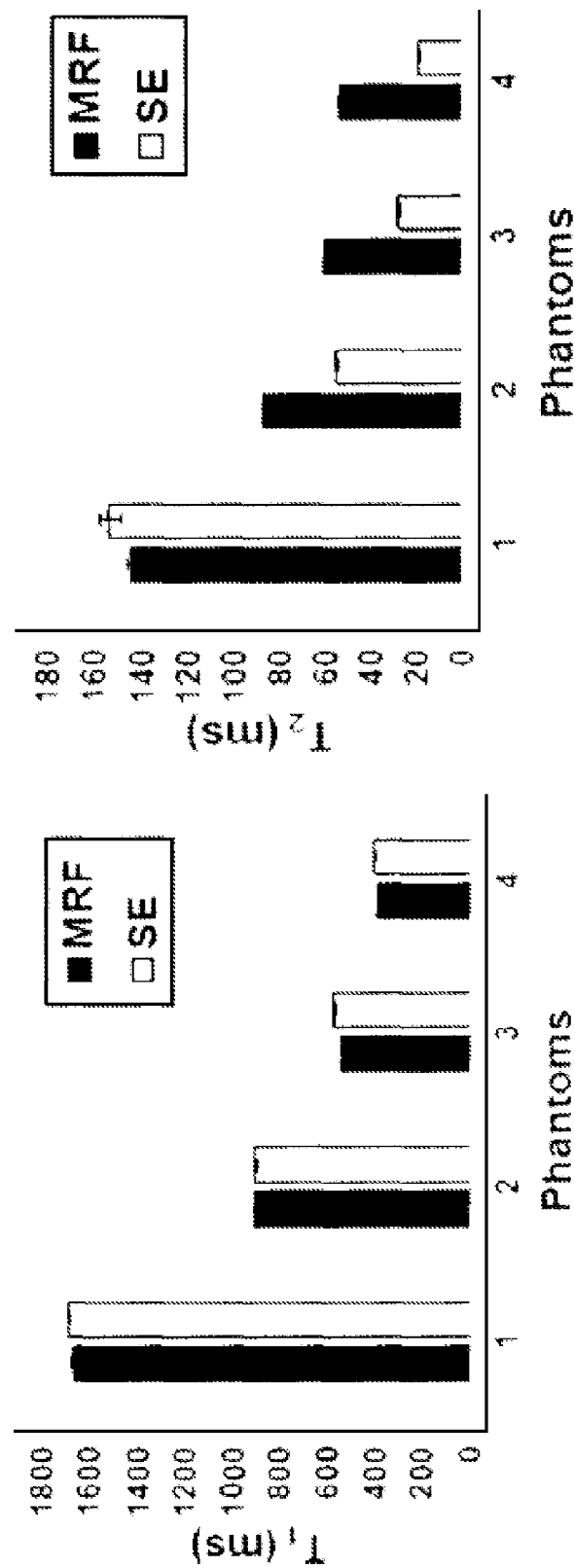
FIG. 4A is a graph of T1 for data acquired from phantoms using a spin echo (SE) pulse sequence compared with the MRF pulse sequence for use with high fields in accordance with the present disclosure.
FIG. 4B is a graph of T2 for data acquired from phantoms using a spin echo (SE) pulse sequence compared with the MRF pulse sequence for use with high fields in accordance with the present disclosure.

A comparison of the performance of SE measures with the MRF results acquired using the systems and methods of the present disclosure is illustrated in FIGS. 4A and 4B, which provide graphs of mean phantom $T_1$ values and $T_2$ values, respectively. Quantitative evaluation of these in vitro MRF against conventional maps showed similar overall results in the MRF data, based on mean (±standard deviations) $T_1$, $T_2$ and $M_0$ values for the MRF from an ROI analysis of the five repeat scans. The MRF-based $T_1$ estimates for all four phantoms were not statistically different from the conventional IR-SE $T_1$ maps (p>0.1), while the mean $T_2$ and $M_0$ MRF estimates exhibited some significant differences. The mean $T_2$ estimates from the MRF scans were significantly higher than from the conventional SE methods for three of the four phantoms (p<0.01) while the phantom with the highest $T_2$ value was significantly lower than the estimates from the conventional SE methods (p<0.01). Two of the four phantoms had significant higher $M_0$ values from MRF scans compared to SE methods (p<0.05). Despite these differences, the MRF results showed significant decreases in both $T_1$ and $T_2$ values for increasing $MnCl_2$ concentrations as expected (p<0.01).

Axial MRF-based $T_1$ and $T_2$ relaxation time and $M_0$ maps from healthy mouse kidneys and brain showed hyperintense regions in the ventricles of the mouse brain and renal medulla, as reflected in the $T_1$ and $T_2$ maps. Importantly, the in vivo kidney $T_1$, $T_2$, and $M_0$ maps were devoid of respiratory motion artifacts typical of conventional in vivo preclinical scans. Only minor ghosting artifacts are visible in the in vivo kidney $T_2$ maps due to aortic pulsatility. In addition, the in vivo and ex vivo kidney maps are very similar with only minor decreases in the ex vivo $T_1$ and $T_2$ values likely due to the absence of flowing blood. As further verification, MRF signal profiles and respective "matched" dictionary profiles from an ROI of the right in vivo and ex vivo kidney were analyzed.

Figure 5:
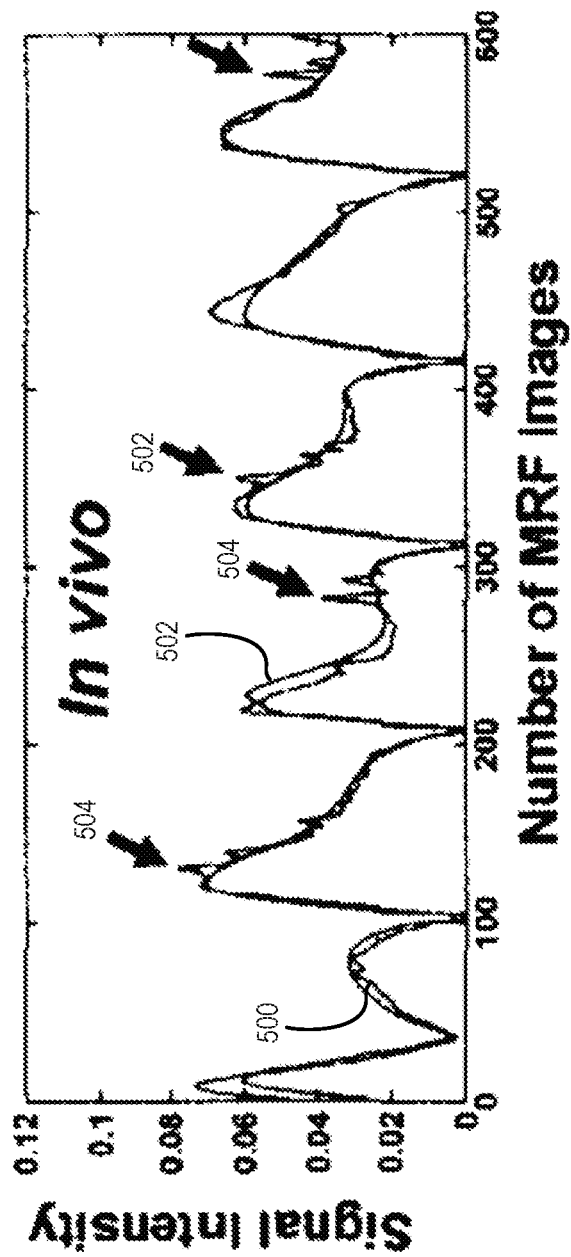
FIG. 5 is a graph of MRF signal intensity profiles acquired without respiratory gating across a series of MR data compared against dictionary data.

Specifically, FIG. 5 provides a graph of signal intensity versus number of MRF images (0-600) that were acquired. The graph shows both the acquired signal 500 for each image, and the dictionary values 500. As can be seen, the acquired signal 500 and dictionary signal 502 are nearly matched, save for a plurality of respiratory motion spikes 504. Thus, as illustrated in FIG. 5, a similar shape of the acquired MRF profiles, aside from the respiratory motion "spikes" for the in vivo MRF scan, were observed. Importantly, the matched MRF profile for the in vivo scan did not include these respiration spikes as the motion is not encoded in any of the signal evolution profiles in the MRF dictionary.

In vivo MRF-based $T_1$, $T_2$, and $M_0$ maps of a fixed ex vivo mouse brain orthotopically implanted with a human glioma cell line were produced. Corresponding $T_2$-weighted anatomic MRI images, combined fluorescence and brightfield images of the GFP expressing glioma cells, and H&E stain validating tumor presence and location were also produced. An ROI analysis showed mean $T_1$, $T_2$ and $M_0$ values in the glioma ($T_1$=1973 ms, $T_2$=82 ms, $M_0$=0.5 ms), cerebral cortex ($T_1$=1470 ms, $T_2$=63 ms, $M_0$=0.4) and thalamus ($T_1$=1273 ms, $T_2$=55 ms, $M_0$=0.4 ms) that are comparable to results in previous studies. No ghosting artifacts were observed in these in vivo MRF $T_2$ maps of a mouse brain.

The $T_1$, $T_2$, and $M_0$ maps were reconstructed from subsets of the same in vivo MRF data using the first 100, 300, 500, and 600 images in the MRF profile, respectively. The MRF maps obtained from reconstruction of the full dataset (N=600) were included as a reference. Mean brain $T_1$, $T_2$, $M_0$ values using the first 600, 500, and 300 images were consistent (range of mean $T_1$=1436 to 1461 ms; range of mean $T_2$=65-69 ms; range of mean $M_0$=0.4-0.5). However, the mean values were substantially different using only the first 100 MRF images in the matching process ($T_1$=1648 ms, $T_2$=52 ms, $M_0$=0.8). While not a rigorous evaluation, these findings illustrate the value of acquiring a sufficient number of MRF images as well as opportunities for optimizations to reduce the overall MRF acquisition time.

MRF $T_1$, $T_2$, and $M_0$ maps were also generated from an ex vivo mouse brain with an implanted glioma using either a sinc7 or hermite RF excitation pulses in the MRF-FISP acquisition. The magnitude of the RF excitation pulse shape and the corresponding measured slice profiles were obtained from the conventional FLASH acquisition. The sinc7 excitation pulse provided a more uniform tip angle across the entire imaging slice and reduced side-band excitations in comparison to the hermite excitation pulse, as expected. The MRF $T_1$ and $T_2$ estimates using the sinc7 RF pulse ($T_1$=970 ms, $T_2$=59 ms, $M_0$=0.8) were lower relative to the corresponding values obtained with the hermite pulse ($T_1$=1078 ms, $T_2$=146 ms, $M_0$=0.7), while the $M_0$ values were slightly lower. Overall, the $T_2$ estimates appear to be more sensitive to excitation profile as the estimates obtained from the sinc7 pulse ($T_2$=59 ms) were approximately one half that obtained from the hermite pulse ($T_2$=146 ms).

The above-described systems and methods for extending MRF techniques to high-field, preclinical MR systems builds upon the previously-reported clinical MRF implementation and combines a priori flip angle and repetition time variation profiles with an adaptable preparation module or modules (e.g., inversion preparation) with a dynamic MR acquisition kernel to obtain MRF signal evolution profiles that can quantify MR-specific parameters (e.g., $T_1$ and $T_2$ relaxation times). The high-field, preclinical MRF techniques provided herein can be used to provide quantitative in vivo assessments of $T_1$, $T_2$, and $M_0$ (and/or virtually any other MR parameter) with resistance to respiratory motion artifacts. In addition, the simultaneous estimation of multiple imaging parameters provides the opportunity to identify and quantify tissue pathophysiology without the physiologic confounds of conventional methods that require sequential parameter estimation. As such, this high-field MRF technique provides a uniquely powerful imaging platform that can be used to assess normal anatomy and physiology as well as disease pathophysiology and therapeutic efficacy in a wide variety of disease models.

By incorporating flip angle and repetition time variation profiles into a dynamic MR imaging acquisition with an initial inversion preparation, a system and method is provided to obtain signal evolution profiles that are sensitive to $T_1$, and $T_2$ relaxation times (or other MR parameters). This new high-field, preclinical MRF technique provides simultaneous estimation of multiple imaging parameters with insensitivity to respiratory motion artifacts typical of previously reported MRI techniques.

The MRF acquisition can be designed with a variety of dynamic MR acquisitions. By using a FISP imaging kernel, instead of True FISP or EPI imaging kernels, "banding" and distortion/ghosting artifacts are controlled in the dynamic MRF images. Importantly, these artifacts are especially problematic on high field MRI scanners due to increased $B_0$ inhomogeneities. The FISP-MRF acquisition also provides increased $T_2$ sensitivity in comparison with other incoherent steady-state MRI techniques, such as FLASH acquisitions. The MRF FA and TR variation profiles illustrated in FIGS. 2B and 2C can also be modified to increase the sensitivity of the signal evolution profiles to the desired MR parameters to be estimated. For example, the sinusoidal FA profiles can be expanded to provide sufficient weighting over the many MRF images. In addition, the Perlin-noise TR variation profile can be used, albeit with an expanded TR range to increase the SNR of the MRF images. The preclinical MRF dictionary may be adjusted to reflect the desired MR parameters to be estimated on high field, preclinical MRI scanners.

The example in vitro MRF results shown here demonstrate that the MRF methodology described herein is comparable to conventional quantitative assessments and, in various settings, superior. The in vitro $T_1$ and $M_0$ values are similar for both the MRF and conventional measures and resulted in significantly different mean $T_1$ values for the different $MnCl_2$-doped phantoms as expected (p<0.0001). As described, the MRF-based estimate at high field, preclinical MR scanners is significantly more uniform than conventional measures. These results are consistent with the original clinical MRF report comparing MRF with DESPOT1 and DESPOT2. While the MRF-based $T_2$ estimates also differentiated the in vitro phantoms (p<0.01), the MRF-estimates were also significantly different than the estimates from the conventional spin echo methods for all four phantoms. Interestingly, the MRF-based $T_2$ estimate were all lower than the conventional methods except for the phantom with the highest $T_2$ value. In addition, the MRF $T_2$ estimates resulted in increased voxel-wise variation. Other dynamic MR acquisition kernels may be implemented within this MRF acquisition (e.g., True FISP) to provide improved $T_2$ accuracy and/or sensitivity to other MR parameters.

Small $B_1$ heterogeneity errors can have an effect on the $T_2$ estimates. In switching from sinc7 to hermite RF excitation pulses, the MRF $T_2$ estimates for the in vitro mouse brain increase from ~60 ms (sinc7) to ~140 ms (hermite). At the same time, the $T_1$ and $M_0$ values also change, but to a much smaller degree. Therefore, it can be desirable to incorporate $B_1$ corrections into the MRF dictionary/reconstruction process in order to improve both the accuracy as well as the uniformity of the $T_2$ estimates. These imperfections in slice profile/tip angle, along with high noise levels, may result in imperfect matches between the acquired and theoretical signal evolution profiles. A straightforward method to correct for $B_1$ inhomogeneities is to measure the $B_1$ field directly, either before or after the MRF data acquisition. Alternatively, the B1 field variation may be directly estimated within the MRF dictionary.

As mentioned above, the high field MRF technique described herein has an inherent resistance to bulk motion artifacts. This resistance to motion artifacts is an advantageous feature for all in vivo preclinical imaging applications because it allows for free breathing (i.e., a lack of breath-holding) and provides the opportunity to avoid respiratory motion artifacts and/or respiratory gating. The underlying cause of the inherent motion insensitivity of the MRF technique is established by maintaining respiration rates of typically 40-60 breaths/minute, with little or no respiratory motion observed for a majority of the time between breaths. As further illustrated in FIG. 5, this ~1 second quiescent period allows up to 100 motion-free MRF data points to be acquired between the ~100 ms respiration "spikes" 502 as shown in FIG. 5. At the same time, the respiratory motion "spikes" were not included in the theoretical MRF dictionary profiles. Therefore, advantageously, the spikes were ignored in the MRF matching process to generate parameter estimates for each voxel with minimal impact of respiratory motion. An alternative to the approach herein is to use multiple navigator pulses to trigger the dynamic MRF acquisition.

The above-described, high-field MRF technique, as described herein, can be extended to non-Cartesian trajectories (e.g. radial, spiral) to reduce the overall acquisition time to acquire the MRF image sets. For example, utilization of a single-shot spiral trajectory, can be used to reduce the overall acquisition time to as little as 10-20 seconds for each imaging slice. Also, Parallel imaging and/or compressed sensing strategies can be incorporated to enable reductions in both Cartesian and non-Cartesian MRF trajectories. Further, the number of MRF images acquired in the above-described experiments can be reduced, for example, halved to 300 images, with no obvious limited impact on $T_1$ and $T_2$ quantification. These reductions in MRF acquisition time can then be utilized to develop effective multi-slice 2D or 3D MRF acquisitions.

The above-described, high-field MRF technique can be used to quantify other MRI parameters besides those described. While this initial implementation focused primarily on estimation of $T_1$ and $T_2$ relaxation times and proton density, the MRF acquisition can be modified to simultaneously estimate perfusion and diffusion parameters, which are important in non-invasively assessing ischemic diseases such as stroke, acute kidney injury, and cardiac injury models. This MRF methodology can be used to assess virtually any MR parameter by tailoring the magnetization preparation module(s) and/or the dynamic MR acqustion modules.

The above-described, high-field MRF technique can be further adapted to perform an assessment of chemical exchange saturation transfer (CEST) and magnetization transfer (MT) contrast mechanisms to assess intracellular pH, ATP depletion rates, cartilage composition, and glucose/glycogen metabolism, for example. These CEST/MT methods require 5-50 sequential acquisitions to generate quantitative assessments resulting in extended acquisition times. Adapting the MRF acquisition to assess these parameters may incorporate specific magnetization preparation periods (ex. an off-resonance CEST preparation pulse schema) at one or more points in the MRF acquisition. Similar to the inversion preparation design used here, this magnetization preparation scheme is used to sensitize the MRF acquisition to the desired parameters of interest. A different MRF dictionary with a range of values for the specific parameters is then used.

In conclusion, a high-field MRF technique is provided that may be used for a variety of applications, including high field, preclinical MRI scanners. An MRF acquisition is presented that limits motion artifacts on high field, preclinical MR scanners to generate both $T_1$ and $T_2$ sensitivity in the dynamic MRF acquisition. In combination with the MRF dictionary, the example MRF-FISP acquisition presented herein resulted in simultaneous $T_1$, $T_2$, and proton density maps of both phantoms and mouse brain and kidneys in a single acquisition. The MRF methodology has demonstrated inherent resistance to respiratory motion artifacts in mouse abdominal imaging applications. This is a significant improvement over conventional MRI techniques relying on either breath holding or respiratory gating which are either not possible or are frequently unreliable in preclinical imaging applications. Initial in vivo mouse brain tumor studies also demonstrate sensitivity to known pathology. This MRF technique can also be adapted to assess other MRI parameters including diffusion and perfusion establishing a platform of MRI technology to enable multi-parametric imaging assessments in rodent models to assess mechanisms of disease initiation and progression as well as the efficacy of novel therapies.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for operating a high-field magnetic resonance (MR) system to acquire quantitative data from a subject arranged with in the MR system, wherein the method includes steps comprising:
    controlling the high-field MR system to perform a preparation module configured to perform one of an inversion pulse or a magnetization preparation;
    controlling the high-field MR system to, following the preparation module, perform a series of data acquisition modules without respiratory gating, wherein each data acquisition module is formed of a steady-state free precession pulse sequence and wherein performing the series of data acquisition modules includes varying at least one of an amplitude of an excitation pulse or a repetition time of the steady-state free precession pulse sequence between adjacent data acquisition modules in the series of data acquisition modules to acquire a series of MR data with random or pseudo-random imaging acquisition parameters;

comparing the series of MR data to a dictionary of signal evolution profiles to determine a match between the series of MR data with at least one signal evolution profile in the dictionary; and generating a report indicating at least one quantitative parameter in the subject based on the MR data and the match to the at least one signal evolution profile in the dictionary.

2. The method of claim 1 wherein the dictionary of signal evolution profiles is free of respiratory spikes.

3. The method of claim 1 wherein varying at least one of an amplitude of an excitation pulse or a repetition time of the steady-state free precession pulse sequence includes performing a sinusoidal FA profile or a Perlin-noise TR variation profile.

4. The method of claim 1 wherein the high-field MR system includes a static magnetic field of at least 4.7 Tesla.

5. The method of claim 1 wherein the signal evolution profiles are sensitive to $T_1$ or $T_2$ relaxation times, or proton density signals.

6. The method of claim 1 wherein the steady-state free precession pulse sequence implements a non-Cartesian sampling pattern.

7. The method of claim 1 wherein MR data includes one of chemical exchange saturation transfer (CEST), magnetization transfer (MT), diffusion, or perfusion weighted data.

8. A magnetic resonance (MR) system, comprising:
a magnet system configured to generate a static magnetic field of at least 4.7 Tesla about at least a portion of a subject arranged in the MR system;
a gradient system configured to establish at least one magnetic gradient field with respect to the static magnetic field;
a radio frequency (RF) system configured to deliver excitation pulses to the subject and acquire imaging data from the subject;
a computer system programmed to:
control the gradient system and RF system to perform a preparation module including one of an inversion pulse or a magnetization preparation;
control the gradient system and RF system to perform a series of data acquisition modules, wherein each data acquisition module is formed of a steady-state free precession pulse sequence and wherein performing the series of data acquisition modules includes varying at least one of an amplitude of an excitation pulse or a repetition time of the steady-state free precession pulse sequence between adjacent data acquisition modules in the series of data acquisition modules to acquire a series of MR data including respiratory spikes; and
compare the series of MR data to a dictionary of signal evolution profiles to determine a match between the series of MR data with at least one signal evolution profile in the dictionary; and
based on the match, determine at least one quantitative parameter of the subject.

9. The MR system of claim 8 wherein the computer system is further programmed to determine the match by comparing the MR data with respiratory spikes to signal evolution profiles without respiratory spikes.

10. The MR system of claim 8 wherein the computer system is further programmed to acquire the MR data during quiescent periods between respiratory motion of the subject.

11. The MR system of claim 8 wherein the computer system is further programmed to vary the at least one of the amplitude of the excitation pulse or the repetition time of the steady-state free precession pulse sequence by performing a sinusoidal FA profile or a Perlin-noise TR variation profile.

12. The MR system of claim 8 wherein the signal evolution profiles are sensitive to $T_1$ or $T_2$ relaxation times, or proton density signals.

13. The MR system of claim 8 wherein the computer system is further programmed to acquire the MR data using a non-Cartesian sampling pattern.

14. The MR system of claim 8 wherein MR data includes one of chemical exchange saturation transfer (CEST), magnetization transfer (MT), diffusion, or perfusion weighted data.

15. The MR system of claim 8 wherein the computer system is further configured to generate a report indicating the at least one quantitative parameter of the subject.

16. The MR system of claim 8 wherein the steady-state free precession pulse sequence includes a fast imaging with steady-state free precession (FISP) pulse sequence.

17. A method for operating a high-field magnetic resonance (MR) system to perform a magnetic resonance fingerprinting process, wherein the method includes steps comprising:
controlling a high-field MR system with a static magnetic field of at least 4.7 Tesla to perform a preparation module configured to perform one of an inversion pulse or a magnetization preparation;
controlling the high-field MR system to, following the preparation module, perform a series of data acquisition modules without respiratory gating, wherein each data acquisition module is formed of a steady-state free precession pulse sequence and wherein performing the series of data acquisition modules includes imaging parameters to acquire a series of MR data;
performing a magnetic resonance fingerprinting reconstruction process by comparing the series of MR data to a dictionary to generate a report indicating at least one quantitative parameter in the subject.

18. The method of claim 17 wherein the dictionary is consists of free-breathing, MR signal evolutions.

19. The method of claim 17 wherein the series of MR data is acquired during quiescent periods between respiratory motion of the subject.

20. The method of claim 17 further comprising generating a report indicating the at least one quantitative parameter in the subject mapped onto an anatomical image of the subject.

* * * * *